United States Patent [19]
Larson et al.

[11] 3,947,696
[45] Mar. 30, 1976

[54] TOUCH ACTUATED ELECTRONIC SWITCH

[75] Inventors: Willis A. Larson, Mequon, Wis.;
David E. Colglazier, Minneapolis, Minn.

[73] Assignee: Magic Dot, Inc., Minneapolis, Minn.

[22] Filed: Nov. 4, 1974

[21] Appl. No.: 520,716

Related U.S. Application Data

[63] Continuation of Ser. No. 323,303, Jan. 12, 1973, abandoned.

[52] U.S. Cl. .......... 307/116; 200/DIG. 2; 340/365 C; 328/5
[51] Int. Cl.² .................. H01H 35/00; H03K 13/00
[58] Field of Search ..... 307/116; 340/365 C, 365 R, 340/258 R, 258 C; 317/DIG. 2, 123; 200/DIG. 1, DIG. 2; 328/5; 179/90 K; 178/17 C, 17.5

[56] References Cited
UNITED STATES PATENTS
3,668,660   6/1972   Watten.......................... 340/365 C

*Primary Examiner*—Herman J. Hohauser
*Attorney, Agent, or Firm*—Wicks & Nemer

[57] ABSTRACT

A touch actuated electronic switch is disclosed including a surface, accessible to the touch of a human, interconnected with a differential amplifier. In the preferred embodiment, if increased noise immunity or noise protection is desired, a twisted pair of wires is used and interconnected at one end with one wire electrically connected to the touch surface and the other substantially equal length wire being unconnected. Both wires, at the other end, are connected to the input to the differential amplifier. A common mode alternating voltage signal is then provided to the differential amplifier and a substantial alternating frequency output signal shunt is applied to the differential amplifier, in the preferred embodiment, across terminals conventionally used for D.C. offset null purposes. The output of the differential amplifier is then interconnected to an integrator, in the preferred embodiment a capacitor, and the integrator is in turn connected to an additional amplifier. The output terminals of the additional amplifier, in the preferred embodiment, act as an electrical switch with the electrical impedance across the output terminals in a first state assuming a high impedance, electrical open circuit, or "OFF" switch condition and in the second state assuming a low impedance, electrical short circuit, or "ON" switch condition to thereby approximate the two states of a conventional mechanical electrical switch, the condition assumed by the second amplifier being dependent upon whether or not an operator has touched the touch surface.

82 Claims, 2 Drawing Figures

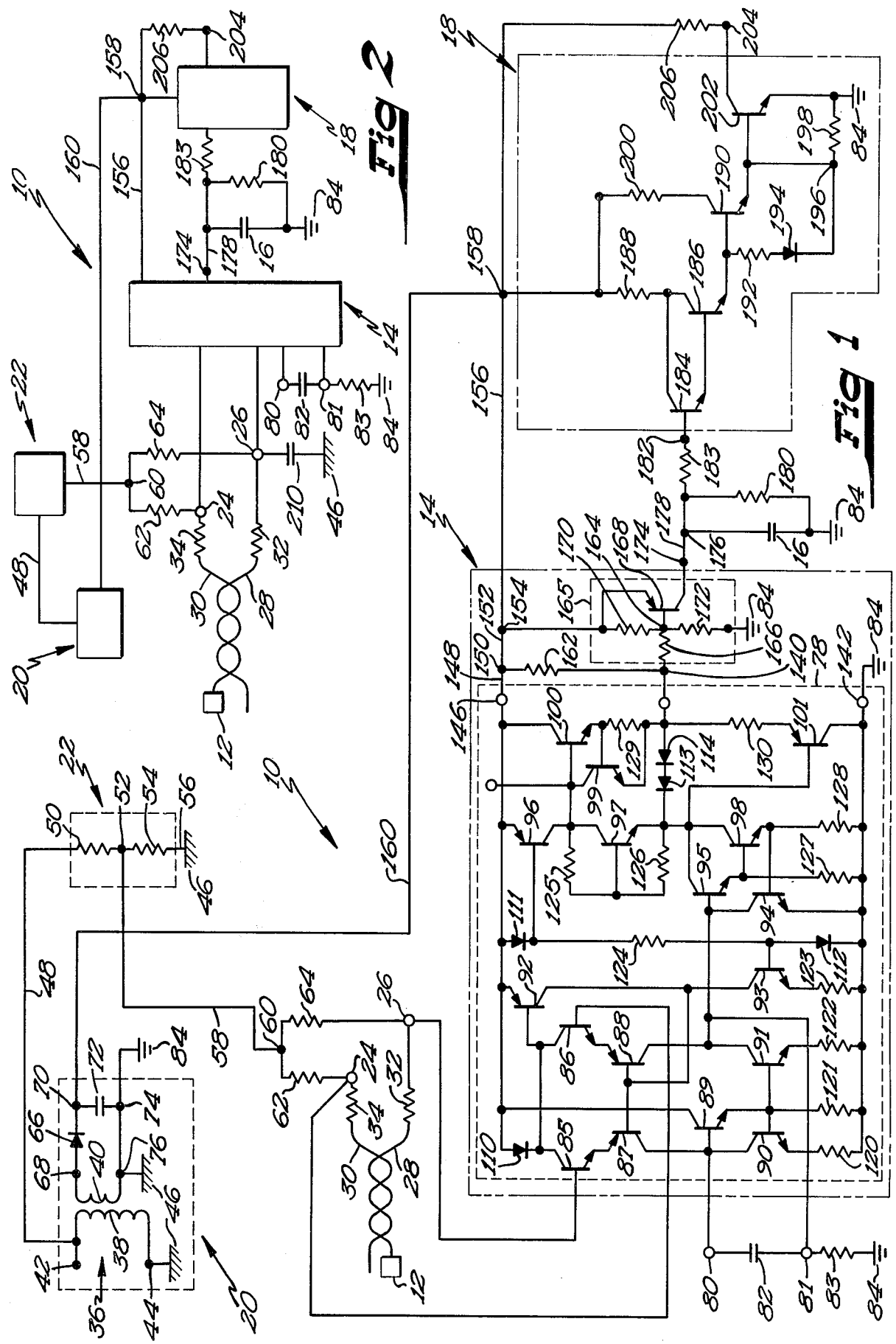

TOUCH ACTUATED ELECTRONIC SWITCH

This is a continuation of application Ser. No. 323,303 filed Jan. 12, 1973, now abandoned.

BACKGROUND

The present invention generally relates to switches, more particularly relates to electronic switches, and still more particularly relates to touch actuated electronic switches.

A touch actuated electronic switch which operates upon the mere touch of an operator and without moving parts is deemed desirable to replace mechanical switching in substantially all switch applications.

Further, a touch actuated electronic switch which can be inexpensively fabricated, which can be fabricated in small size, which is reliable, which provides a high noise suppression or immunity, which is easily fabricated, and which operates upon input currents of a level below that dangerous to humans is to be desired.

The present invention provides a switch having these and other advantages.

SUMMARY

The preferred embodiment of a touch actuated electronic switch of the present invention includes the touch surface interconnected by a twisted pair of wires with the differential input of a differential amplifier. At the touch surface, one wire of the twisted pair is electrically interconnected with the touch surface and the other substantially equal length wire remains unconnected.

Also, in the preferred embodiment, a common mode voltage is provided from the conventional A.C. power lines to the differential input of the differential amplifier and a substantial output alternating frequency signal shunt is applied to the differential amplifier by the connection of a capacitor across terminals conventionally used for D.C. offset null purposes. If the differential amplifier is to be of the grounded variety, this common mode input may be provided by an electrical interconnection to the power lines through a pair of input resistors. If a switch of the floating variety is desired, this electrical interconnection can be provided, for example, by the electrical oscilllation of the secondary of a transformer used in the power supply to the switch.

The output from the differential amplifier is then provided to an integrating capacitor and to an additional amplifier with sufficient power capabilities to satisfy the needs of the electronic switch.

The use of a differential amplifier in the switch of the present invention allows increased noise immunity or suppression at least because it allows a substantial output signal shunt of the alternating frequency signal. Also, the use of a differential amplifier allows the use of a long twisted pair input where desirable.

It is thus a primary object of the present invention to provide a novel touch actuated electronic switch.

It is a further object of the present invention to provide such a switch which may be easily fabricated.

It is a further object of the present invention to provide such a switch which may be inexpensively fabricated.

It is a further object of the present invention to provide such a switch which may be fabricated of small size.

It is a further object of the present invention to provide such a switch which is reliable.

It is a further object of the present invention to provide such a switch with high noise suppression or immunity.

It is a further object of the present invention to provide such a switch where sensitivity can be controlled without significant detriment to the switching characteristics.

It is a further object of the present invention to provide such a switch which allows the touch surface to be located remotely of the remainder of the switch.

It is a further object of the present invention to provide such a switch which allows an increased suppression of ambient signals unrelated to actuation of the switch.

It is a further object of the present invention to provide such a switch which can operate on input currents of a level below that dangerous to humans.

These and further objects and advantages of the present invention will become clearer in light of the following detailed description of an illustrative embodiment of this invention described in connection with the drawings.

DESCRIPTION OF THE DRAWINGS

FIG. 1 shows a schematic representation of a touch actuated electronic switch according to the present invention with various portions of the schematic enclosed within dashed lines and a combination of dashed and solid lines to indicate major functional blocks.

FIG. 2 shows an alternate embodiment of the present invention.

DESCRIPTION

In the figures, the touch actuated electronic switch of the present invention, generally designated 10, is shown as including a touch surface 12, a differential amplifier block 14, an integrating means, in the form of a capacitor 16, and an additional amplifier block 18. A power supply 20 providing power to the aforementioned parts is also shown as is a source of common mode alternating voltage signal, designated 22.

With more particularity, touch surface 12 in FIG. 1 is shown as connected to inputs 24 and 26 of differential amplifier 14 by a twisted pair of wires 28 and 30. Wire 28 is electrically connected between touch surface 12 and input 26 through a resistor 32 inserted to assure a level of current below that dangerous to humans as between touch surface 12 and the remaining electronics. Similarly, wire 30 is connected to input 24 through a resistor 34 and is of substantially the same length as wire 28, extending out and in the vicinity of touch plate 12 but remaining unconnected. The twisted pair 28 and 30 is used to obtain a better noise suppression or noise immunity in conjunction with differential amplifier 14.

Also connected to differential amplifier input terminals 24 and 26 is a common mode alternating voltage signal from block 22. With more particularity, power supply 20 includes a transformer generally designated 36 having a primary winding 38 and a secondary winding 40. Primary winding 38 includes terminals 42 and 44 connected to a source of alternating frequency power with terminal 44 shown as connected to earth ground, designated 46.

Block 22 is also connected between terminals 42 of transformer 36 and earth ground 46, as by wire 48 having one end connected to terminal 42 and the other end connected to a voltage divider resistor 50. Resistor 50 in turn is connected to a junction point 52 also connected to an additional voltage divider resistor 54 which, in turn, is connected to earth ground 46 by a wire 56. Block 22 is then connected to inputs 24 and 26 by a wire 58 extending between junction point 52 within block 22 and a further junction point 60 connected to input 24 through a resistor 62 and to input 26 through a resistor 64.

The remaining parts of power supply 20 include a rectifying diode 66 connected between a first terminal 68 of transformer secondary 40 and a junction point 70 also connected to one side of a filtering capacitor 72. The other connection to capacitor 72 is made to a junction point 74 which is also connected to another terminal 76 of transformer secondary 40 and to earth ground 46.

Differential amplifier 14 includes a conventional amplifier, designated 78, which in the preferred embodiment is a type of amplifier available in integrated form under the number designation "748" from many suppliers. The number "748" amplifier, designated 78 in the figures, is quite similar if not identical in operation and configuration to a further amplifier available in integrated form under the standard numerical designation "741" except that terminals designated 80 and 81 in the figures, conventionally termed offset null terminals, are interconnected with the outputs of the first differential stage in the "748" variety of amplifier 78 shown in the figures and are interconnected with the emitters of the first stage transistors in the "741" amplifier variety, as is well-known to those skilled in the art.

A means for providing a substantial output signal shunt to amplifier 78 at the alternating frequency received at inputs 24 and 26 is shown in the form of capacitor 82 connected across high impedance terminals 80 and 81, previously used for the setting of a D.C. offset null.

Also, a resistor 83 for setting the state of switch 10 of the present invention is connected between terminal 81 and circuit ground 84.

Thus, amplifier 78 includes transistors 85 to 101, inclusive, diodes 110 to 114, inclusive, and resistors 120 to 130, inclusive, conventionally interconnected between inputs 24 and 26 and an amplifier output 140. A bias terminal 142 for amplifier 78 is connected to circuit ground 84 and a second bias terminal 146 is connected to the source of positive D.C. voltage from power supply 20, as available at junction point 70, by means of wire 148, junction point 150, wire 152, junction point 154, wire 156, junction point 158, and wire 160. A load resistor 162 is then connected between amplifier output 140 and junction point 150.

Output 140 is also connected to junction point 164 of an additional amplifier 165 within differential amplifier 14. In particular, junction point 164 is interconnected with junction point 140 by resistor 166 and is also connected to the base of a transistor 168, to junction point 154 by a resistor 170, and to circuit ground 84 by a resistor 172. Transistor 168 has its emitter connected to junction point 154 its collector connected to the output 174 for composite and its amplifier 14.

Output 174 of amplifier 14 is then connected to a junction point 176 through a wire 178. Junction point 176 is further connected to circuit ground 84 through a parallel connection of capacitor 16 and a resistor 180.

Junction point 176 is also connected to the input 182 to amplifier 18 through a resistor 183.

Amplifier 18 includes a Darlington arrangement of NPN transistors 184 and 186 having their common collectors connected to junction point 158 through a current limiting resistor 188. The base of transistor 184 is connected to amplifier input 182, while the emitter of transistor 186 is connected to the base of a further NPN transistor 190 and to circuit ground 84 through a series connection of resistor 192, diode 194, junction point 196, and resistor 198. The collector of transistor 190 is also connected to junction point 158 through a further current limiting resistor 200. Junction point 196 is also connected to the emitter of transistor 190 and to the base of a further NPN transistor 202 which has its collector connected to output 204 of amplifier 18 and its emitter connected to circuit ground 84.

The load resistor for the present invention is generally designated 206 and shown as connected between output 204 and junction point 158. It will be recognized by those skilled in the art that load resistor 206 may represent an actual resistor or any other electronic load for the switch 10 of the present invention. Depending upon the current requirements of the actual load required to be switched, as represented by load resistor 206, the precise configuration of the electronic switch of the present invention will be set. That is, while the switch will always include an amplifier 14 having a differential input, the precise number of amplification stages will be dictated by the current requirements and nature of the load. That is, since the input current desired to be utilized is below the threshold found harmful to humans, i.e. below 1 microamp, the number of amplification stages necessary to amplify and sense this current reliably and provide the desired output current to load 206 will simply be the number of stages required to provide whatever output current is desired from the preferred low level input current available. Therefore, the configuration of amplifier 14 may change radically as by increasing in amplification stages, generally with an increasing output current requirements, or decreasing in amplification stages. Also, the exact configuration of amplifier 18 will change with changing requirements on the switch and may not be required at all.

Preferred values for various of the components of the switch 10 of the present invention may now be given. The voltage provided by power supply 20 is of a polarity and value compatible with the remainder of the circuit. In the preferred embodiment shown, a voltage at junction point 70 is shown as positive with respect to circuit ground 84 and of a value of 15 volts. No limitation whatever to this polarity or value is intended.

Further, as a general comment, while preferred values of electronic components are given hereinafter, it will be realized by those skilled in the art that no limitation to these values is intended unless specifically indicated. The values are given as a guide and as an aid to persons lawfully using and utilizing the present invention.

The value of resistors 32 and 34 are in the megohm range and, as indicated, are intended to protect the user of the touch surface 12 from any possible electrical shock hazard, electrical insulation breakdown, or the like.

Resistors 62 and 64 are in the range of 100 kilohms to 50 megohms with a preferred value in the area of 5 megohms. With a low value of resistance, a lower differential signal input is provided to actuate the switch, as will be explained hereinafter. Conversely, a higher value allows an easier actuation of the switch by providing a higher differential signal input.

Resistors 50 and 54 are for voltage division of an alternating voltage signal and are generally in the range of 10 kilohms into the megohm area. Also, block 22 including these resistors may take other forms and yet provide the common mode signal requirements of the present invention. These other forms may embody a transformer with an output at the desired voltage, possibly a voltage tap on transformer 36 of power supply 20, a large series resistor to reduce voltage and current to desired values, an oscillator, or the like.

The value of resistor 83 is in the range of 100 kilohm to 100 megohm with the lower range of resistances providing a lower switch sensitivity and higher noise immunity.

The value of capacitor 82 is in the range of 1000 picofarads to 0.1 microfarad with a sensitivity reduction noticed at approximately 0.05 microfarad. Operational results have been achieved at values of capacitor 82 up to more than two microfarads, however, with a decrease in sensitivity for the circuit.

The alternating frequency for which all values are chosen is 60 hertz, the conventional powerline frequency available without effort. Other frequencies may be used.

The value of capacitor 16 is on the order of 1000 picofarads and is chosen at such value since a capacitor of this size may be currently fabricated by integration or a thick film technique so as to be mass produced in sizes on the order of a few thousandths of an inch square. The value of capacitor 16 is also selected to assure that the output current from amplifier 14 is sufficient to charge capacitor 16 within the period of the alternating frequency of interest to thus provide a rapid actuation of the switch.

Resistor 180 has been found useful to aid the recycling time of the switch of the present invention. Values on the order of 20 megohms have been found to provide such an advantage while not substantially discharging capacitor 16 in the active mode of the switching circuitry.

OPERATION

Basically, the switch 10 of the present invention operates upon the touch of surface 12 by an operator. The capacitance of the operator's body, found to be approximately 100 picofarads, provides an unbalanced or differential input signal to differential amplifier 14 which affects the charge of capacitor 16. The charge of capacitor 16 then affects the state of amplifier 18 such that the electrical impedance between terminals 204 and circuit ground 84 take a first state assuming a high impedance, electrical open circuit, or "OFF" switch condition or a second state assuming a low impedance, electrical short circuit, or "ON" switch condition to thereby approximate the two states of a conventional mechanical electrical switch, with the condition assumed by the impedance between terminals 204 and 84 being dependent upon whether or not an operator has touched the touch surface 12.

More particularly, common mode block 22 provides an alternating voltage common mode signal to both unbiased inputs 24 and 26 of differential amplifier 14. Because of well-known differential amplifier characteristics, there is no change of signal output at output 174 of differential amplifier 14, i.e. ideally, equal signals at the differential inputs 24 and 26 produces no differing output.

Assuming amplifier 14 is operated such that the quiescent D.C. voltage at output 140 of amplifier 78 is either near the supply voltage appearing at junction point 150 or near the voltage appearing at circuit ground 84, transistor 168 is either fully conducting or fully nonconducting. Thus, the voltage upon capacitor 16 is either the supply voltage or zero voltage. This will be the normal condition assuming that amplifier 78 is operating in an open loop, full gain condition since its gain is typically 200,000 volts per volt for a "748" amplifier, and any small D.C. imbalance will cause the output to approach its voltage limits.

The particular state of the output 140 of amplifier 78 is either controlled internally, as with some amplifiers, or by other means such as optional resistor 83 which by its impedance to circuit ground from terminal 81 controls the voltage at output 140 of amplifier 78 to near supply voltage with no operator's touch at touch surface 12. The state of amplifier 78 may then be changed by attaching resistor 83 to terminal 80 or by other conventional means, if desired.

Notice that this flexibility in the state of amplifier 78, and thus the state of the entire amplifier 14, allows the switch 10 of the present invention to exist in either an "ON" or "OFF" switch condition indicated above before the operator's touch and the converse switch condition after the operator's touch. Further, by appropriate latching or other feedback, the switch 10 of the present invention can be made as a latching switch or any other switch configuration rather than the momentary switch discussed above.

Assuming for discussion a quiescent condition with the voltage at junction point 140 approaching the supply voltage at junction point 150, transistor 168 is in a cutoff condition during this quiescent state, and no voltage exists across capacitor 16. This renders the transistors within amplifier 18 nonconducting and causes a high impedance to exist across switch terminals 204–84.

Assuming this quiescent condition for the switch, the operator's touch at touch surface 12 provides a capacitance of approximately 100 picofarads between input 26 to differential amplifier 14 and ground and provides an unbalanced or differential signal to amplifier 14. That is, a current flows around a loop from block 22, through resistor 64, through resistor 32, through touch plate 12, through the capacitance of the human, and to ground. This current causes an imbalance which causes an input signal to differential amplifier 14 causing the amplifier to change states at output 140.

It is to be noticed at this point that capacitor 82 across what are conventionally direct current offset voltage null terminals provides a substantial output shunt which eliminates the effect of small imbalances and allow the switch of the present invention to operate. Without this output shunt, noise probelms can prevent proper operation of the switch 10 of the present invention.

Thus, assuming noise problems have been eliminated and a change of state has been caused at output 140 as discussed above, the state of transistor 168 is changed. capacitor 16 is charged, and the charge upon capacitor 16 in conjunction with transistor 184 appears as a current source to amplifier 18. This input current renders the transistors within amplifier 18 conducting and causes a change of state in switch 10 such that output terminals 204–84 change from a high impedance to a low impedance condition.

It may also be desirable to remove one or more of the connections between circuit ground and earth ground in the switch of the present invention and float the switch with respect to ground. In this case, the circuitry of the present invention can remain unchanged, or block 22 and its associated common mode signal may be eliminated if oscillation is provided to amplifier 14 through a floating power supply 20 or other technique as set forth in application Ser. No. 235,671 filed Mar. 17, 1972 for "Touch Actuated Electronic Switch" in the name of Willis A. Larson, now U.S. Pat. No. 3,862,432.

Another embodiment of the present invention is shown generally in block form in FIG. 2. In this embodiment, an unbalanced input signal is purposely provided to differential amplifier 14 by the addition of capacitor 210 between input 26 and earth ground 46. Capacitor 210, in the preferred embodiment, is approximately 100 picofarads to substantially equal the nominal capacitance of a human. This unbalanced input then causes a first output switch state.

Upon touching surface 12, in this embodiment connected to wire 30, the operator adds a capacitance balancing capacitor 210 and the input to amplifier 14 is again brought into balance to thus change the output switch state and indicate a switch actuation.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is indicated by the appended claims, rather than by the foregoing description, and all changes which come within the meaning and range of equivalency of the claims are intended to be embraced therein.

What is claimed is:

1. A touch actuated electronic switch, comprising in combination: differential amplifier means including first signal input means and second signal input means for receiving differential signals to be amplified and including signal output means for providing an amplified output signal related to an input signal received; a touch surface; means for providing an electrical connection between the touch surface and an input means to the differential amplifier means; means for receiving an alternating frequency voltage; means for providing an electrical connection between the receiving means and the differential amplifier means to provide a substantially equal common mode alternating voltage to the differential amplifier input means; integrating means; and means for providing an electrical connection between the output means of the differential amplifier means and the integrating means.

2. The touch actuated electronic switch of claim 1, including means for providing a substantial output signal shunt to the differential amplifier means at the alternating frequency received from the receiving means.

3. The touch actuated electronic switch of claim 2, including additional amplifier means including signal input means for receiving a signal to be amplified and signal output means for providing an amplified signal output; and means for providing an electrical connection between the integrating means and the input means of the additional amplifier means.

4. The touch actuated electronic switch of claim 3 wherein the means for providing an electrical connection between the receiving means and the differential amplifier includes impedance means connected to the first signal input means and impedance means connected to the second signal input means.

5. The touch actuated electronic switch of claim 4, wherein the means for providing an electrical connection between the touch surface and an input to the differential amplifier means comprises a twisted pair of wires with one wire connected to one signal input means of the differential amplifier means and the second wire connected to the remaining signal input means of the differential amplifier means for better providing noise immunity between the touch surface and the differential amplifier means.

6. The touch actuated electronic switch of claim 2, wherein the means for providing an electrical connection between the touch surface and an input to the differential amplifier means comprises a twisted pair of wires with one wire connected to one signal input means of the differential amplifier means and the second wire connected to the remaining signal input means of the differential amplifier means for better providing noise immunity between the touch surface and the differential amplifier means.

7. The touch actuated electronic switch of claim 2, wherein the means for providing an electrical connection between the receiving means and the differential amplifier includes impedance means connected to the first signal input means and impedance means connected to the second signal input means.

8. The touch actuated electronic switch of claim 7, wherein the means for providing an electrical connection between the touch surface and an input to the differential amplifier means comprises a twisted pair of wires with one wire connected to one signal input means of the differential amplifier means and the second wire connected to the remaining signal input means of the differential amplifier means for better providing noise immunity between the touch surface and the differential amplifier means.

9. The touch actuated electronic switch of claim 1 wherein the means for providing an electrical connection between the receiving means and the differential amplifier includes impedance means connected to the first signal input means and impedance means connected to the second signal input means.

10. The touch actuated electronic switch of claim 1, wherein the means for providing an electrical connection between the touch surface and an input to the differential amplifier means comprises a twisted pair of wires with one wire connected to one signal input means of the differential amplifier means and the second wire connected to the remaining signal input means of the differential amplifier means for better providing noise immunity between the touch surface and the differential amplifier means.

11. A touch actuated electronic switch, comprising in combination: differential sensing means including first signal input means and second signal input means for receiving differential signals and including signal output means for providing an output signal related to the input signals received; a single touch surface; means for providing an electrical connection between the touch surface and an input means to the differential sensing means; means for receiving an alternating voltage; means for providing an electrical connection between the receiving means and the diffential sensing means to provide a substantially equal common mode alternating voltage to the input means of the sensing means.

12. The touch actuated electronic switch of claim 11, including integrating means; and means for providing an electrical connection between the output means of the differential sensing means and the integrating means.

13. The touch actuated electronic switch of claim 12, wherein the means for providing an electrical connection between the output means of the differential sensing means and the integrating means comprises unidirectional conduction means.

14. The touch actuated electronic switch of claim 13, wherein the differential sensing means comprises differential amplifier means.

15. The touch actuated electronic switch of claim 14, wherein the differential amplifier means is arranged to provide substantially open loop gain.

16. The touch actuated electronic switch of claim 14, including means for providing a substantial output signal shunt to the differential amplifier means at the alternating frequency received from the receiving means.

17. The touch actuated electronic switch of claim 16, wherein the differential amplifier means includes offset voltage null terminals and wherein the means for providing the substantial output signal shunt includes impedance means connected across the offset null terminals.

18. THe touch actuated electronic switch of claim 17, wherein the shunt impedance means includes a capacitor.

19. The touch actuated electronic switch of claim 14, wherein the means for providing an electrical connection between the touch surface and an input to the differential sensing means comprises a twisted pair of wires with one wire connected to one signal input means of the differential sensing means and the second wire connected to the remaining signal input means of the differential sensing means for better providing noise immunity between the touch surface and the differential sensing means.

20. The touch actuated electronic switch of claim 14, wherein the means for receiving the alternating voltage comprises means for receiving an alternating voltage at power frequencies.

21. The touch actuated electronic switch of claim 14, including means for causing the differential sensing means to assume a preferred output state in the absence of input signals.

22. The touch actuated electronic switch of claim 21, wherein the means for causing the differential sensing means to assume a preferred output state in the absence of input signals comprises impedance.

23. The touch actuated electronic switch of claim 22, wherein the impedance for causing the differential sensing means to assume a preferred output state in the absence of input signals comprises a capacitor connected to a signal input means of the sensing means.

24. The touch actuated electronic switch of claim 12, wherein the differential sensing means comprises differential amplifier means.

25. The touch actuated electronic switch of claim 24, wherein the differential amplifier means is arranged to provide substantially open loop gain.

26. The touch actuated electronic switch of claim 24, including means for providing a substantial output signal shunt to the differential amplifier means at the alternating frequency received from the receiving means.

27. The touch actuated electronic switch of claim 26, wherein the differential amplifier means includes offset voltage null terminals and wherein the means for providing the substantial output signal shunt includes impedance means connected across the offset null terminals.

28. The touch actuated electronic switch of claim 27, wherein the shunt impedance means includes a capacitor.

29. The touch actuated electronic switch of claim 24, wherein the means for providing an electrical connection between the touch surface and an input to the differential sensing means comprises a twisted pair of wires with one wire connected to one signal input means of the differential sensing means and the second wire connected to the remaining signal input means of the differential sensing means for better providing noise immunity between the touch surface and the differential sensing means.

30. The touch actuated electronic switch of claim 24, wherein the means for receiving the alternating voltage comprises means for receiving an alternating voltage at power frequencies.

31. The touch actuated electronic switch of claim 24, including means for causing the differential sensing means to assume a preferred output state in the absence of input signals.

32. The touch actuated electronic switch of claim 31, wherein the means for causing the differential sensing means to assume a preferred output state in the absence of input signals comprises impedance.

33. The touch actuated electronic switch of claim 32, wherein the impedance for causing the differential sensing means to assume a preferred output state in the absence of input signals comprises a capacitor connected to a signal input means of the sensing means.

34. The touch actuated electronic switch of claim 12, wherein the means for providing an electrical connection between the touch surface and an input to the differential sensing means comprises a twisted pair of wires with one wire connected to one signal input means of the differential sensing means and the second wire connected to the remaining signal input means of the differential sensing means for better providing noise immunity between the touch surface and the differential sensing means.

35. The touch actuated electronic switch of claim 12, wherein the means for receiving the alternating voltage comprises means for receiving an alternating voltage at power frequencies.

36. The touch actuated electronic switch of claim 11, wherein the differential sensing means comprises differential amplifier means.

37. The touch actuated electronic switch of claim 36, wherein the differential amplifier means is arranged to provide substantially open loop gain.

38. The touch actuated electronic switch of claim 36, including means for providing a substantial output signal shunt to the differential amplifier means at the alternating frequency received from the receiving means.

39. The touch actuated electronic switch of claim 38, wherein the differential amplifier means includes offset voltage null terminals and wherein the means for providing the substantial output signal shunt includes impedance means connected across the offset null terminals.

40. The touch actuated electronic switch of claim 39, wherein the shunt impedance means includes a capacitor.

41. The touch actuated electronic switch of claim 36, wherein the means for providing an electrical connection between the touch surface and an input to the differential sensing means comprises a twisted pair of wires with one wire connected to one signal input means of the differential sensing means and the second wire connected to the remaining signal input means of the differential sensing means for better providing noise immunity between the touch surface and the differential sensing means.

42. The touch actuated electronic switch of claim 36, including means for causing the differential sensing means to assume a preferred output state in the absence of input signals.

43. The touch actuated electronic switch of claim 42, wherein the means for causing the differential sensing means to assume a preferred output state in the absence of input signals comprises impedance.

44. The touch actuated electronic switch of claim 43, wherein the impedance for causing the differential sensing means to assume a preferred output state in the absence of input signals comprises a capacitor connected to a signal input means of the sensing means.

45. The touch actuated electronic switch of claim 11, wherein the means for providing an electrical connection between the touch surface and an input to the differential sensing means comprises a twisted pair of wires with one wire connected to one signal input means of the differential sensing means and the second wire connected to the remaining signal input means of the differential sensing means for better providing noise immunity between the touch surface and the differential sensing means.

46. The touch actuated electronic switch of claim 11, wherein the means for receiving the alternating voltage comprises means for receiving an alternating voltage at power frequencies.

47. The touch actuated electronic switch of claim 11, including means for causing the differential sensing means to assume a preferred output state in the absence of input signals.

48. The touch actuated electronic switch of claim 47, wherein the means for causing the differential sensing means to assume a preferred output state in the absence of input signals comprises impedance.

49. The touch actuated electronic switch of claim 48, wherein the impedance for causing the differential sensing means to assume a preferred output state in the absence of input signals comprises a capacitor connected to a signal input means of the sensing means.

50. A touch actuated electronic switch, comprising in combination: differential sensing means including first signal input means and second signal input means for receiving differential signals and including signal output means for providing an output signal related to the input signals received; a touch surface; means for providing an electrical connection between the touch surface and the input means to the differential sensing means comprising a twisted pair of wires of long length, with an end of the pair of wires having one wire connected to the first signal input means and having the remaining wire connected to the second signal input means; means for receiving an alternating frequency voltage; means for providing an electrical connection between the receiving means and the differential sensing means to provide a substantially equal common mode alternating frequency voltage to the input means of the sensing means.

51. The touch actuated electronic switch of claim 50, including integrating means; and means for providing an electrical connection between the output means of the differential sensing means and the integrating means.

52. The touch actuated electronic switch of claim 51, wherein the means for providing an electrical connection between the output means of the differential sensing means and the integrating means comprises unidirectional conduction means.

53. The touch actuated electronic switch of claim 52, wherein the differential sensing means comprises differential amplifier means.

54. The touch actuated electronic switch of claim 53, wherein the differential amplifier means is arranged to provide substantially open loop gain.

55. The touch actuated electronic switch of claim 53, including means for providing a substantial output signal shunt to the differential amplifier means at the alternating frequency received from the receiving means.

56. The touch actuated electronic switch of claim 55, wherein the differential amplifier means includes offset voltage null terminals and wherein the means for providing the substantial output signal shunt includes impedance means connected across the offset null terminals.

57. The touch actuated electronic switch of claim 56, wherein the shunt impedance means includes a capacitor.

58. The touch actuated electronic switch of claim 53, wherein the means for receiving the alternating voltage comprises means for receiving an alternating voltage at power frequencies.

59. The touch actuated electronic switch of claim 53, including means for causing the differential sensing means to assume a preferred output state in the absence of input signals.

60. The touch actuated electronic switch of claim 51, wherein the differential sensing means comprises differential amplifier means.

61. The touch actuated electronic switch of claim 60, wherein the differential amplifier means is arranged to provide substantially open loop gain.

62. The touch actuated electronic switch of claim 60, including means for providing a substantial output signal shunt to the differential amplifier means at the alternating frequency received from the receiving means.

63. The touch actuated electronic switch of claim 62, wherein the differential amplifier means includes offset voltage null terminals and wherein the means for providing the substantial output signal shunt includes impedance means connected across the offset null terminals.

64. The touch actuated electronic switch of claim 63, wherein the shunt impedance means includes a capacitor.

65. The touch actuated electronic switch of claim 60, wherein the means for receiving the alternating voltage comprises means for receiving an alternating voltage at power frequencies.

66. The touch actuated electronic switch of claim 60, including means for causing the differential sensing means to assume a preferred output state in the absence of input signals.

67. The touch actuated electronic switch of claim 66, wherein the means for causing the differential sensing means to assume a preferred output state in the absence of input signals comprises impedance.

68. The touch actuated electronic switch of claim 67, wherein the impedance for causing the differential sensing means to assume a preferred output state in the absence of input signals comprises a capacitor connected to a signal input means of the sensing means.

69. The touch actuated electronic switch of claim 51, wherein the means for receiving the alternating voltage comprises means for receiving and alternating voltage at power frequencies.

70. The touch actuated electronic switch of claim 50, wherein the differential sensing means comprises differential amplifier means.

71. The touch actuated electronic switch of claim 70, wherein the differential amplifier means is arranged to provide substantially open loop gain.

72. The touch actuated electronic switch of claim 70, including means for providing a substantial output signal shunt to the differential amplifier means at the alternating frequency received from the receiving means.

73. The touch actuated electronic switch of claim 72, wherein the differential amplifier means includes offset voltage null terminals and wherein the means for providing the substantial output signal shunt includes impedance means connected across the offset null terminals.

74. The touch actuated electronic switch of claim 73, wherein the shunt impedance means includes a capacitor.

75. The touch actuated electronic switch of claim 70, including means for causing the differential sensing means to assume a preferred output state in the absence of input signals.

76. The touch actuated electronic switch of claim 75, wherein the means for causing the differential sensing means to assume a preferred output state in the absence of input signals comprises impedance.

77. The touch actuated electronic switch of claim 76, wherein the impedance for causing the differential sensing means to assume a preferred output state in the absence of input signals comprises a capacitor connected to a signal input means of the sensing means.

78. The touch actuated electronic switch of claim 70, wherein the means for receiving the alternating voltage comprises means for receiving an alternating voltage at power frequencies.

79. The touch actuated electronic switch of claim 50, wherein the means for receiving the alternating voltage comprises means for receiving an alternating voltage at power frequencies.

80. The touch actuated electronic switch of claim 50, including means for causing the differential sensing means to assume a preferred output state in the absence of input signals.

81. The touch actuated electronic switch of claim 80, wherein the means for causing the differential sensing means to assume a preferred output state in the absence of input signals comprises impedance.

82. The touch actuated electronic switch of claim 81, wherein the impedance for causing the differential sensing means to assume a preferred output state in the absence of input signals comprises a capacitor connected to a signal input means of the sensing means.

* * * * *